United States Patent [19]

Fox

[11] 4,443,715
[45] Apr. 17, 1984

[54] DRIVER CIRCUIT

[75] Inventor: Jeffrey R. Fox, Concord, Mass.

[73] Assignee: GTE Laboratories Incorporated, Waltham, Mass.

[21] Appl. No.: 361,714

[22] Filed: Mar. 25, 1982

[51] Int. Cl.³ .................... H03K 3/01; H03K 17/687
[52] U.S. Cl. ................................... 307/270; 307/482; 307/578; 307/581
[58] Field of Search ............... 307/482, 270, 482, 574, 307/578, 581

[56] References Cited

U.S. PATENT DOCUMENTS 4,176,289 11/1979 Leach et al. ..................... 307/578
4,395,644 7/1983 Misaizu ............................ 307/578

OTHER PUBLICATIONS

Chan, J. Y. et al., "A 100 ns 5V Only 64K × 1 MOS Dynamic RAM," IEEE Journal of Solid-State Circuits, vol. SC-15, No. 5, pp. 839-846, 1980.

Primary Examiner—Stanley D. Miller
Assistant Examiner—B. P. Davis
Attorney, Agent, or Firm—David M. Keay

[57] ABSTRACT

An MOS FET inverter driver circuit. A first FET of the depletion type, a resistance formed by a depletion type FET having its gate connected to its drain, and a second FET of the enhancement type are connected in series between a positive voltage source and ground. Third and fourth FET's both of the enhancement type are also connected in series between the voltage source and ground. The gates of the first, second, and fourth FET's are connected directly to an input terminal. The gate of the third FET is connected to the juncture of the resistance FET and the second FET. A capacitance is connected between the juncture of the resistance FET and the first FET and the juncture of the third and fourth FET's, an output terminal is also connected to this juncture. The circuit obtains bootstrap action by virtue of the capacitance to provide high voltage drive to turn the third FET, the output pull-up transistor, on. The direct connection from the input terminal to the gates of the first, second, and fourth FET's further contributes to high speed operation of the circuit.

6 Claims, 1 Drawing Figure

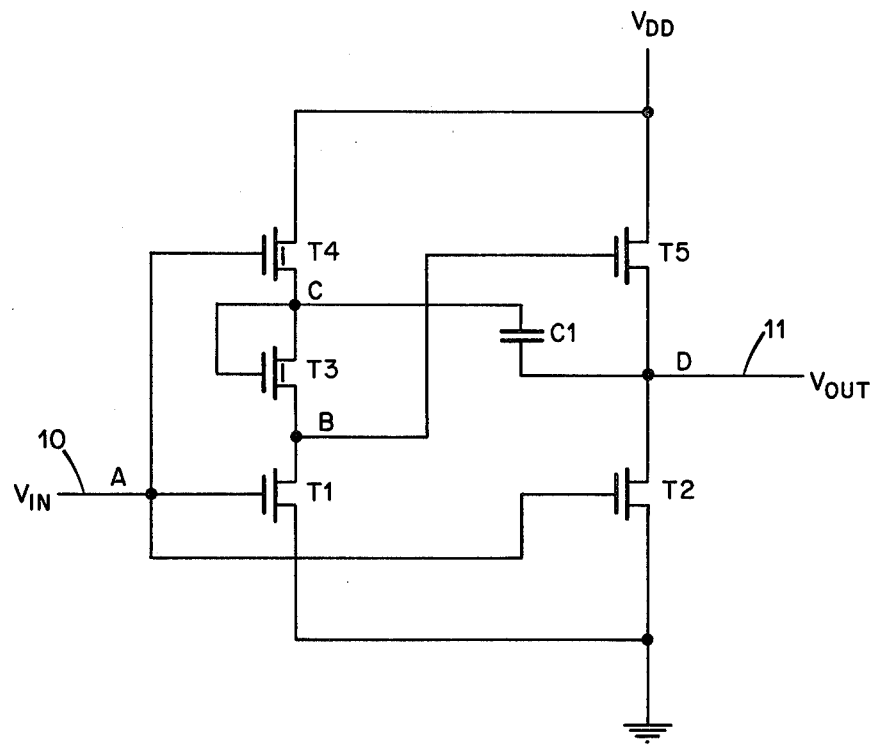

4,443,715

DRIVER CIRCUIT

BACKGROUND OF THE INVENTION

This invention relates to driver circuits. More particularly, it is concerned with driver circuits employing metal-oxide-silicon (MOS) field effect transistors (FET's).

Many digital output, or driver, circuits, which may be inverter circuits, have been developed for use in MOS FET integrated circuits. Recently improved circuits have been developed which reduce the consumption of DC power when the circuit is in one or the other of its two logic states. It is desirable that circuits of this type operate at fairly high speed in switching between logic states. In addition, it is desirable that the circuits produce maximum and minimum voltage levels for the logic 1 and logic 0 outputs, preferably close to that of the voltage source and ground. Although certain of these criteria have been met with available circuits, they require many components which add to the complexity of the circuit and cause propagation delays therethrough when the circuit is switching from one logic state to the other.

SUMMARY OF THE INVENTION

An improved high speed, low component count driver circuit is provided by a circuit in accordance with the present invention which comprises an input terminal for receiving input signals of either a first or a second voltage level and an output terminal. A first field effect transistor, an impedance means, and a second field effect transistor are connected in series between a source of operating potential and a point of reference potential. A third field effect transistor and a fourth field effect transistor are also connected in series between the source of operating potential and the point of reference potential. The input terminal is directly connected to the gate electrodes of the first, second, and fourth field effect transistors. A capacitance means is connected between the juncture of the first field effect transistor and the impedance means and the juncture of the third and fourth field effect transistors. The output terminal is connected to the juncture of the third and fourth field effect transistors. In response to an input signal of the first voltage level at the input terminal, an output signal of the second voltage level is produced at the output terminal. In response to an input signal of the second voltage level at the input terminal, an output signal of the first voltage level is produced at the output terminal.

BRIEF DESCRIPTION OF THE DRAWING

The sole FIGURE of the drawing is a schematic circuit diagram of a driver circuit in accordance with the present invention.

For a better understanding of the present invention, together with other and further objects, advantages, and capabilities thereof, reference is made to the following discussion and appended claims in connection with the above-described drawing.

DETAILED DESCRIPTION OF THE INVENTION

The single FIGURE of the drawing illustrates a metal-oxide-silicon (MOS) field effect transistor (FET) driver circuit in accordance with the present invention. In the circuit illustrated all of the FET's are N-channel devices of either the enhancement or depletion type. As is well understood, the FET devices of the circuit as well as other circuit components and their interconnections as illustrated may be fabricated as an integrated circuit in a single body of semiconductor material.

The driver circuit as illustrated in the FIGURE has an input terminal 10 to which is applied an input signal $V_{IN}$ which is a relatively high voltage representing a logic 1 or a relatively low voltage representing a logic 0. An inverted output signal $V_{OUT}$ is produced at an output terminal 11.

The circuit includes a depletion type FET T4, a depletion type FET T3, and an enhancement type FET T1 connected in series between a positive voltage source $V_{DD}$ and ground. The gate of FET T3 is connected directly to the juncture of the source of FET T4 and the drain of FET T3. The input terminal 10 is connected directly to the gates of FET's T1 and T4. An enhancement type FET T5 and an enhancement type FET T2 are also connected in series between the positive voltage source $V_{DD}$ and ground. The gate of FET T2 is connected directly to the input terminal 10 and the gate FET T5 is connected directly to the juncture of the source of FET T3 and the drain of FET T1. The juncture of the source of FET T5 and the drain of FET T2 is connected directly to the output terminal 11. A capacitance C1 is connected between the juncture of FET's T4 and T3 and the juncture of FET's T5 and T2. The capacitance C1 is provided by a depletion type FET in which the source and drain are connected together to form one plate of the capacitance and the gate electrode forms the other plate. The gate electrode is connected to the juncture of FET's T4 and T3, and the source and drain are connected to the juncture of FET's T5 and T2.

When a relatively high voltage (logic 1) approaching that of the voltage source $V_{DD}$ is present at the input terminal 10 (point A), FET's T4, T1, and T2 are biased on. Conduction through FET T1 causes point B to approach ground potential causing the output pull-up transistor FET T5 to be turned off. FET T2 is also turned on causing the output voltage $V_{OUT}$ at the output terminal 11 (point D) to become low (logic 0), approaching ground. Since FET T4 is also turned on, the voltage at point C tends to approach $V_{DD}$. Thus, capacitance C1 becomes charged to a voltage close to $V_{DD}$.

FET T3 functions as a resistance between points B and C. Its parameters are chosen so that the resulting resistance value provides sufficient isolation between points B and C while permitting reasonably rapid charging of the gate capacitance of FET T5. In order to obtain maximum voltage across the capacitance C1 ignoring the gate capacitance of FET T5, FET T3 should provide a high resistance. FET T5 would then be completely turned off and capacitance C1 would be charged to the full supply voltage $V_{DD}$. However, FET T5 does have a gate capacitance and the charging time constant of that capacitance is proportional to the resistance of FET T3 and the gate capacitance of FET T5. Therefore, the value of the resistance provided by FET T3 is chosen to provide a compromise of the desired isolation between points B and C and a satisfactory RC time constant for charging the gate capacitance of FET T5.

When the input voltage $V_{IN}$ at point A is reduced to a value approaching ground representing logic 0, FET's T1, T2, and T4 are turned off causing the potential at point B to increase. By virtue of the well-known bootstrap principle, the precharged potential of approximately $V_{DD}$ across the capacitance C1 is placed in series with the potential at point D causing the potential at point C to rise toward twice $V_{DD}$. The source and drain of FET T4 are thereby reversed. Since FET T3, acting as a resistance, is a depletion type device, there is no DC voltage drop from its drain to its source and the full potential at point C is also present at point B. Thus high voltage gate drive is applied to FET T5 causing it to switch on rapidly. This action together with FET T2 being turned off by direct application of the input voltage quickly raises the potential at point D to approximately $V_{DD}$. The output signal $V_{OUT}$ at the output terminal 11 represents a logic 1.

In the circuit as described the use of the bootstrap principle to provide high voltage gate drive to turn on the pull-up transistor FET T5 contributes to high speed operation. Since only one of the two output transistors FET T2 or FET T5 is conducting at any instant, there is no DC power drain and an adequately low logic 0 is readily obtained at the output terminal 11. By virtue of the direct connections from the input terminal 10 to the gates of FET's T1, T2, and T4 there is no propagation delay through other components of the circuit when these transistors are being turned on or off. In addition, the circuit is extremely uncomplicated requiring only five MOS FET's and a single capacitance.

While there has been shown and described what is considered a preferred embodiment of the present invention, it will be obvious to those skilled in the art that various changes and modifications may be made therein without departing from the invention as defined by the appended claims.

What is claimed is:

1. A driver circuit comprising
   an input terminal for receiving input signals having a first voltage level or a second voltage level;
   an output terminal;
   a first field effect transistor, an impedance means, and a second field effect transistor connected in series between a source of operating potential and a point of reference potential;
   said first field effect transistor being connected to said impedance means at a juncture of said first field effect transistor and said impedance means;
   said impedance means being connected to said second field effect transistor at a juncture of said impedance means and said second field effect transistor;
   a third field effect transistor and a fourth field effect transistor connected in series between the source of operating potential and the point of reference potential;
   said third field effect transistor being connected to said fourth field effect transistor at a juncture of said third field effect transistor and said fourth field effect transistor;
   said input terminal being directly connected to the gate electrodes of the first field effect transistor, the second field effect transistor, and the fourth field effect transistor;
   the juncture of said impedance means and said second field effect transistor being directly connected to the gate electrode of the third field effect transistor; and
   capacitance means connected between the juncture of said first field effect transistor and said impedance means and the juncture of said third field effect transistor and said fourth field effect transistor;
   said output terminal being connected to the juncture of said third field effect transistor and said fourth field effect transistor.

2. A driver circuit in accordance with claim 1 wherein
   said first field effect transistor is of the depletion type.

3. A driver circuit in accordance with claim 2 wherein
   said impedance means is a fifth field effect transistor of the depletion type having its gate electrode connected directly to the juncture of said first field effect transistor and said fifth field effect transistor.

4. A driver circuit in accordance with claim 3 wherein
   said second, third, and fourth field effect transistors are of the enhancement type.

5. A driver circuit in accordance with claim 4 wherein
   said field effect transistors are N-channel metal-oxide-silicon field effect transistors.

6. A driver circuit in accordance with claim 5 wherein
   said first voltage level is higher than said second voltage level; and
   in response to an input signal of said first voltage level at said input terminal an output signal of said second voltage level is produced at said output terminal, and in response to an input signal of said second voltage level at said input terminal an output signal of said first voltage level is produced at said output terminal.

* * * * *